US009177853B1

United States Patent
Futase et al.

(10) Patent No.: US 9,177,853 B1
(45) Date of Patent: Nov. 3, 2015

(54) BARRIER LAYER STACK FOR BIT LINE AIR GAP FORMATION

(71) Applicant: SanDisk Technologies Inc., Plano, TX (US)

(72) Inventors: Takuya Futase, Nagoya (JP); Katsuo Yamada, Yokkaichi (JP); Tomoyasu Kakegawa, Yokkaichi (JP); Noritaka Fukuo, Yokkaichi (JP); Yuji Takahashi, Yokkaichi (JP)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/496,360

(22) Filed: Sep. 25, 2014

Related U.S. Application Data

(60) Provisional application No. 61/993,264, filed on May 14, 2014.

(51) Int. Cl.
 *H01L 21/762* (2006.01)
 *H01L 21/768* (2006.01)
 *H01L 21/764* (2006.01)

(52) U.S. Cl.
 CPC ........ *H01L 21/76289* (2013.01); *H01L 21/764* (2013.01); *H01L 21/7682* (2013.01)

(58) Field of Classification Search
 CPC ............ H01L 21/76289; H01L 21/764; H01L 21/7682
 See application file for complete search history.

(56) References Cited

U.S. PATENT DOCUMENTS

| | | | |
|---|---|---|---|
| 7,737,015 B2 | 6/2010 | Kohli et al. | |
| 7,795,080 B2 | 9/2010 | Orimoto et al. | |
| 7,800,155 B2 | 9/2010 | Matsuno | |
| 7,863,190 B1 | 1/2011 | Papasouliotis | |
| 7,884,415 B2 | 2/2011 | Nagano | |
| 7,905,959 B2 | 3/2011 | Tzu et al. | |
| 8,053,347 B2 | 11/2011 | Kang et al. | |
| 8,129,264 B2 | 3/2012 | Kim et al. | |
| 8,362,542 B2 | 1/2013 | Kang et al. | |
| 8,383,479 B2 | 2/2013 | Purayath et al. | |
| 8,492,224 B2 * | 7/2013 | Purayath et al. | 438/257 |
| 8,546,239 B2 | 10/2013 | Harari et al. | |
| 8,603,890 B2 | 12/2013 | Purayath et al. | |
| 2006/0194390 A1 | 8/2006 | Imai et al. | |
| 2007/0063256 A1 * | 3/2007 | Imai et al. | 257/315 |
| 2007/0184615 A1 | 8/2007 | Brazzelli et al. | |
| 2007/0257305 A1 | 11/2007 | Sasago et al. | |
| 2008/0003743 A1 | 1/2008 | Lee | |
| 2008/0283898 A1 | 11/2008 | Kuniya | |
| 2009/0206391 A1 * | 8/2009 | Ando et al. | 257/324 |
| 2009/0212352 A1 | 8/2009 | Aoyama et al. | |
| 2009/0267131 A1 | 10/2009 | Nitta | |
| 2010/0019311 A1 | 1/2010 | Sato et al. | |
| 2010/0127320 A1 | 5/2010 | Nishihara et al. | |
| 2010/0230741 A1 | 9/2010 | Choi et al. | |
| 2011/0057250 A1 | 3/2011 | Higashi | |
| 2011/0303967 A1 | 12/2011 | Harari et al. | |
| 2011/0309430 A1 | 12/2011 | Purayath et al. | |
| 2012/0086678 A1 | 4/2012 | Chang et al. | |
| 2012/0168899 A1 * | 7/2012 | Kim et al. | 257/522 |

* cited by examiner

*Primary Examiner* — Allen Parker

(74) *Attorney, Agent, or Firm* — Davis Wright Tremaine LLP

(57) ABSTRACT

Air gaps are formed between conductive metal lines that have an inner barrier layer and an outer barrier layer. An etch step to remove sacrificial material is performed under a first set of process conditions producing a byproduct that suppresses further etching. A byproduct removal step performed under a second set of process conditions removes the byproduct.

20 Claims, 9 Drawing Sheets

(Section A-A)

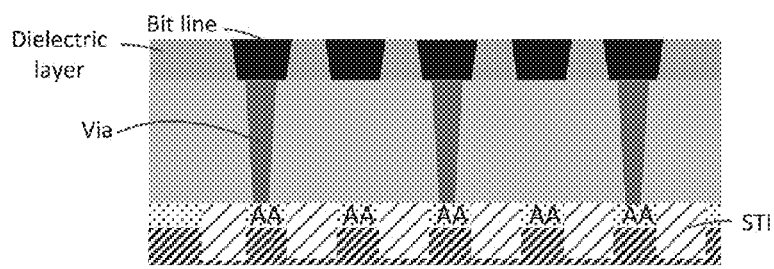
FIG. 2C (Prior Art)
(Section B-B)
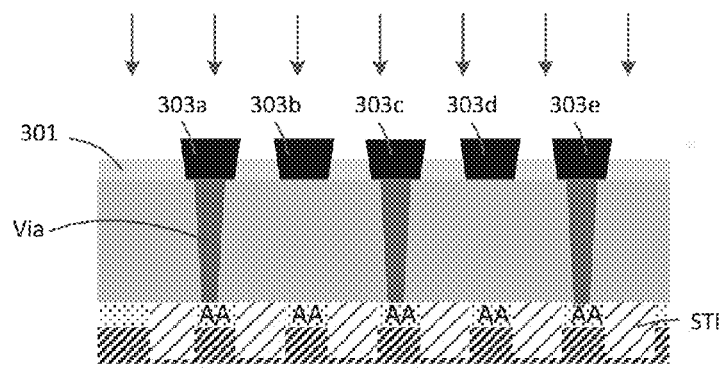
FIG. 3
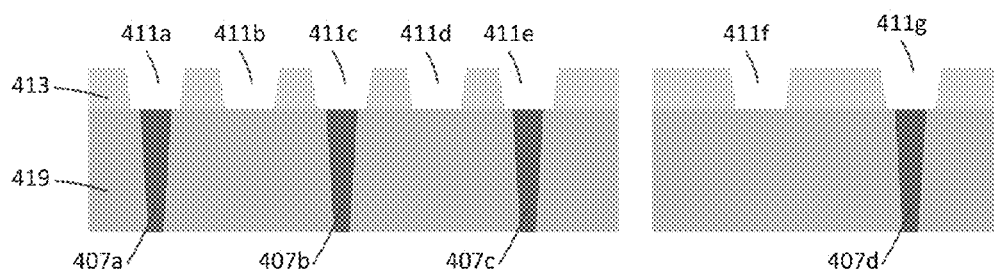
FIG. 4A  FIG. 4B

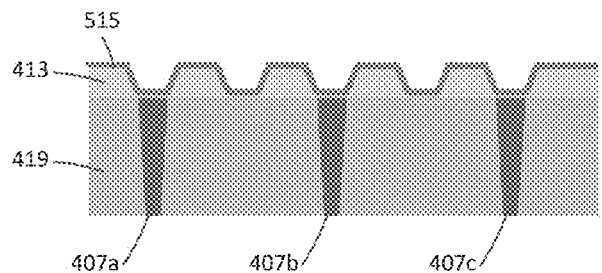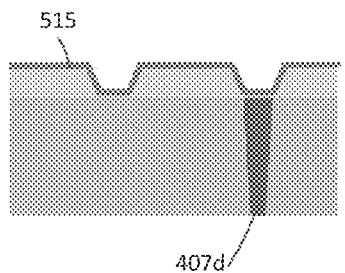
*FIG. 5A*  *FIG. 5B*
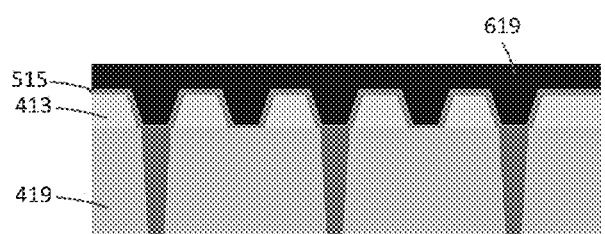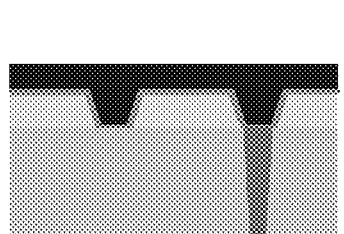
*FIG. 6A*  *FIG. 6B*
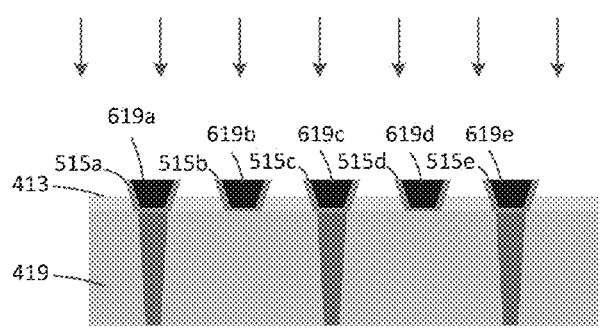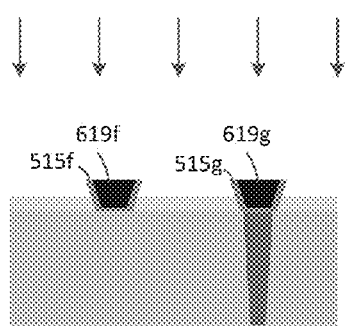
*FIG. 7A*  *FIG. 7B*

BARRIER LAYER STACK FOR BIT LINE AIR GAP FORMATION

The present application claims the benefit of U.S. Provisional Patent Application No. 61/993,264, entitled, "Stacked Barrier Metal for Forming Bit line Air Gap" filed on May 14, 2014, which is hereby incorporated by reference in its entirety.

BACKGROUND

This application relates generally to non-volatile semiconductor memories of the flash memory type, their formation, structure and use.

There are many commercially successful non-volatile memory products being used today, particularly in the form of small form factor cards, USB drives, embedded memory, and Solid State Drives (SSDs) which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

The top and bottom of the string connect to the bit line and a common source line respectively through select transistors (source select transistor and drain select transistor). Select transistors do not contain floating gates and are used to connect NAND strings to control circuits when they are to be accessed, and to isolate them when they are not being accessed.

NAND strings are generally connected by conductive lines in order to form arrays that may contain many NAND strings. At either end of a NAND string a contact area may be formed. This allows connection of the NAND string as part of the array. Metal contacts may be formed over contact areas to connect the contact areas (and thereby connect NAND strings) to conductive metal lines that extend over the memory array (e.g. bit lines). FIG. 2A shows bit line contacts BL0-BL4 and common source line contacts at either end of NAND strings. Contacts to contact areas may be formed by etching contact holes through a dielectric layer and then filling the holes with metal. Metal lines, such as bit lines, extend over the memory array and in peripheral areas in order to connect the memory array and various peripheral circuits. These metal lines may be close together (particularly in the memory array area where bit lines may be very close) which tends to make processing difficult and provides a risk of capacitive coupling. The characteristics of such lines (e.g. resistance) may affect memory operation.

Thus, there is a need for a memory chip manufacturing process that forms uniform low resistance conductive lines, such as bit lines, in close proximity in an efficient manner.

SUMMARY

According to an example of formation of a memory integrated circuit, air gaps are formed between bit lines by removing sacrificial material in a series of etch steps that produce an etch-inhibiting byproduct and removal steps that selectively remove the byproduct Removal may be selective according to geometry so that byproduct is removed at a high rate over sacrificial material (thus exposing the sacrificial material for subsequent etching) while byproduct may be removed at a low rate in other areas so that it remains in those areas and inhibits further etching. For example, an inner barrier layer may be exposed in a narrow gap between bit line metal and an outer barrier layer. Byproduct may remain in such a narrow gap during a removal step so that the byproduct subsequently protects the inner barrier layer from damage during removal of sacrificial material. When the desired amount of sacrificial material has been removed, a final removal step, which may be performed at a higher temperature than other steps, removes remaining byproduct including byproduct in narrow gaps.

An example of a method of forming an air gap between adjacent conductive lines includes: forming a plurality of trenches in a dielectric layer that is formed of a dielectric material; subsequently forming a first barrier layer in the plurality of trenches; subsequently forming a second barrier layer over the first barrier layer; and subsequently filling the plurality of trenches with a conductive metal to form bit lines; subsequently removing dielectric material between bit lines by: (a) performing a Chemical Dry Etching (CDE) step under a first set of process conditions thereby substantially etching the dielectric material and the second barrier layer without substantially etching the first barrier layer, the etching of the dielectric material under the first set of process conditions producing a byproduct that suppresses the etching of the dielectric material: and (b) subsequently performing a removal step to remove the byproduct of the etching of the dielectric material in the CDE step under a second set of process conditions.

The second barrier layer may be formed of a barrier metal; and the first barrier layer may be a nitride or an oxide of the barrier metal. Under the first set of process conditions an etchant may be supplied; and under the second set of process conditions no etchant may be supplied. The first set of process conditions may include a first temperature that is lower than a sublimation temperature of the byproduct, and the second set of process conditions may include a second temperature that is higher than the sublimation temperature of the byproduct. Steps (a) and (b) may be repeated two or more times until a predetermined amount of the dielectric material is removed. The etchant may be a gas containing fluorine (F) and hydrogen (H); and the byproduct may contain ammonium fluorosilicate $((NH_4)_2SiF_6)$. The example may also include: (c) subsequently, after a predetermined amount of the dielectric material is removed, performing an anneal step at a temperature that his higher than any of: a sublimation temperature of the byproduct and any temperature of the first or second sets of process conditions. The second barrier layer may be exposed to the CDE step in an opening between the first barrier layer and the conductive metal, the opening may have a width that is equal to or smaller than 1/10 of a width of exposed dielectric portions between the bit lines. The first barrier layer may be titanium nitride (TiN), the second barrier layer may be titanium (Ti), and the conductive metal may be copper (Cu). The first set of process conditions may provide equilibrium between producing the byproduct and removing the byproduct from areas between the bit lines while generating some buildup of the byproduct over exposed areas of the second barrier layer to provide suppressed etching of the second barrier layer, and the second set of process conditions may be sufficient to remove the byproduct only from the areas between the bit lines. An area of the second layer may be exposed to the CDE step and the area may have a width along a direction perpendicular to the bit lines that is smaller than a distance between neighboring bit lines.

An example of a method of forming air gaps between bit lines includes: (a) forming a plurality of bit lines in a dielectric material, an individual bit line having an inner barrier layer and an outer barrier layer; (b) subsequently etching the dielectric material using an etch step that etches the inner barrier layer, does not significantly etch the outer barrier layer, and etches the dielectric material to produce a byproduct that suppresses further etching; (c) subsequently removing the byproduct using a removal step that removes substantially all of the byproduct from over the dielectric material between bit lines and leaves at least some of the byproduct on surfaces of the inner barrier layer, and (d) repeating steps (b) and (c) until a predetermined amount of the dielectric material is removed.

The inner barrier layer may be formed of titanium, the outer barrier layer may be formed of titanium nitride, and the byproduct may be ammonium fluorosilicate $(NH_4)_2SiF_6$. The etch step may be performed using a gas mixture that contains fluorine (F) and hydrogen (H). The etch step may be performed at a temperature below the sublimation temperature of ammonium fluorosilicate and the removal step may be performed at a temperature above the sublimation temperature of ammonium fluorosilicate. Subsequent to step (d), an anneal step may be performed to remove any remaining byproduct from over the dielectric material between bit lines and from surfaces of the inner barrier layer.

An example of a method of forming air gaps between bit lines may include: (a) forming a plurality of bit lines in a sacrificial layer of silicon oxide, an individual bit line having an inner barrier layer of titanium and an outer barrier layer of titanium nitride; (b) subsequently etching the silicon oxide using an etch step that etches the titanium of the inner barrier layer, does not significantly etch the titanium nitride of the outer barrier layer, and etches the silicon oxide to produce a byproduct containing ammonium fluorosilicate $(NH_4)_2SiF_6$ that suppresses further etching; (c) subsequently removing the byproduct using a removal step that removes substantially all of the byproduct from over the silicon oxide between bit lines and leaves at least some of the byproduct on surfaces of the inner barrier layer; and (d) repeating steps (b) and (c) until a predetermined amount of the silicon oxide is removed. Subsequent to removing the predetermined amount of silicon oxide a final removal step may remove substantially all of the byproduct on surfaces of the inner barrier layer. The removal step may apply a temperature below 150 degrees centigrade and the final removal step may apply a temperature above 150 degrees centigrade. Step (b) may etch approximately 1-2 nanometers of silicon oxide and may be repeated at least 10 times.

Various aspects, advantages, and features are included in the following description of certain examples, which description should be taken in conjunction with the accompanying drawings.

BRIEF DESCRIPTION OF THE DRAWINGS

FIG. 2C shows another cross section of the NAND array of FIG. 2A.
FIG. 3 illustrates an example of formation of air gaps between bit lines.
FIGS. 4A and 4B illustrate an example of a memory array area and peripheral area respectively at an intermediate stage of fabrication.
FIGS. 5A and 5B illustrate the integrated circuit of FIGS. 4A and 4B at a subsequent stage of fabrication after barrier layer formation.
FIGS. 6A and 6B illustrate the integrated circuit of FIGS. 5A and 5B at a subsequent stage of fabrication after deposition of bit line metal.
FIGS. 7A and 7B illustrate the integrated circuit of FIGS. 6A and 6B at a subsequent stage of fabrication after planarization.

DETAILED DESCRIPTION

Memory System

Figure 1:
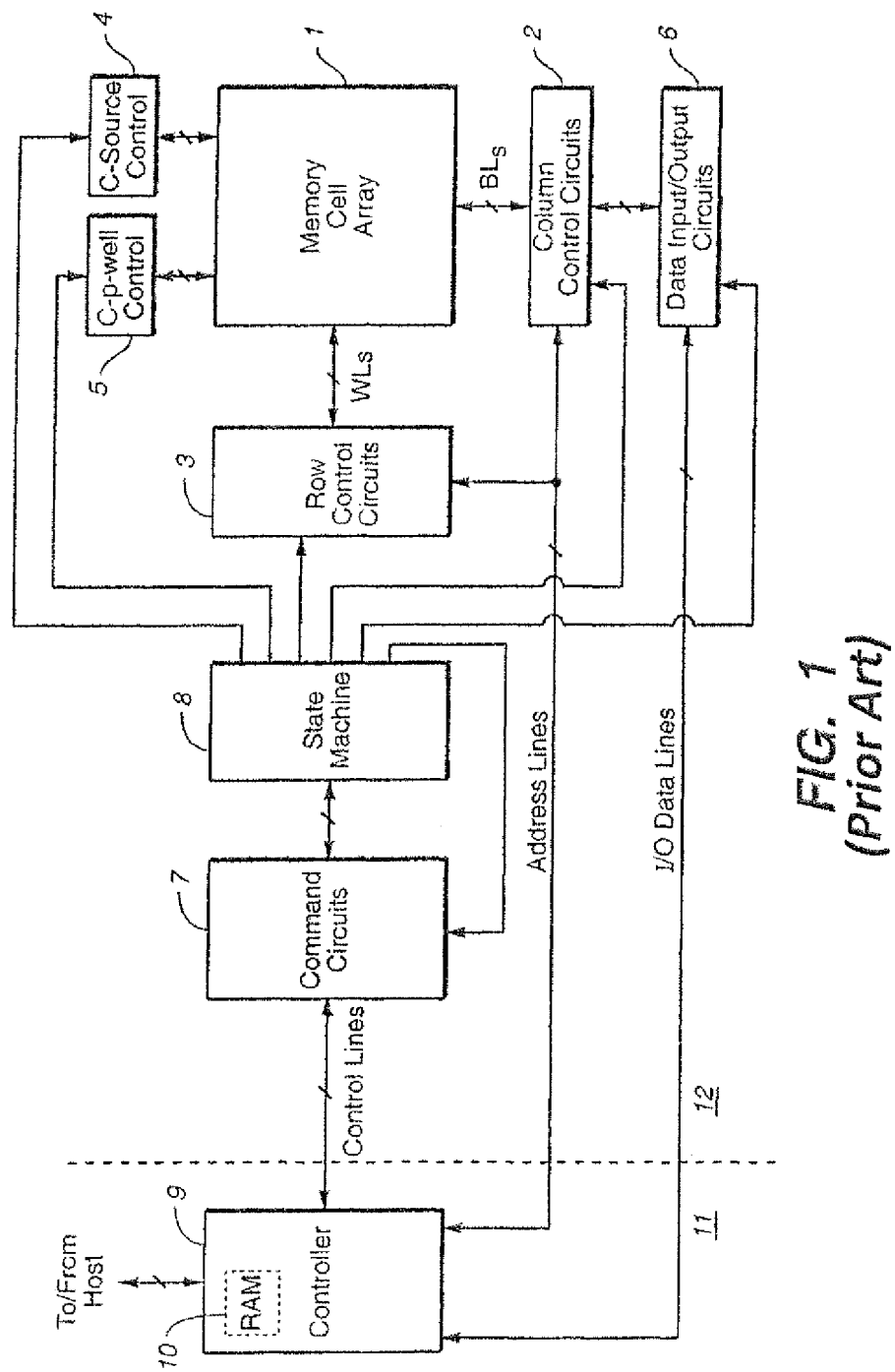
FIG. 1 is a block diagram of a prior art memory system.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other examples, types of memory other than the two dimensional and three dimensional exemplary structures described here may be used.

An example of a prior art memory system is illustrated by the block diagram of FIG. 1. A planar memory cell array 1 including a plurality of memory cells is controlled by a column control circuit 2, a row control circuit 3, a c-source control circuit 4 and a c-p-well control circuit 5. The memory cell array 1 is, in this example, of the NAND type similar to that described above in the Background. A control circuit 2 is connected to bit lines (BL) of the memory cell array 1 for reading data stored in the memory cells, for determining a state of the memory cells during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells are formed. The c-source control circuit 4 controls a common source line (labeled as "c-source" in FIG. 1) connected to the memory cells (M). The c-p-well control circuit 5 controls the c-p-well voltage.

The data stored in the memory cells are read out by the column control circuit 2 and are output to external I/O lines via an I/O line and a data input/output buffer 6. Program data to be stored in the memory cells are input to the data input/ output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. The memory system of FIG. 1 may also be used in a Solid State Drive (SSD) or similar unit that provides mass data storage in a tablet, laptop computer, or similar device. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Figure 2A:
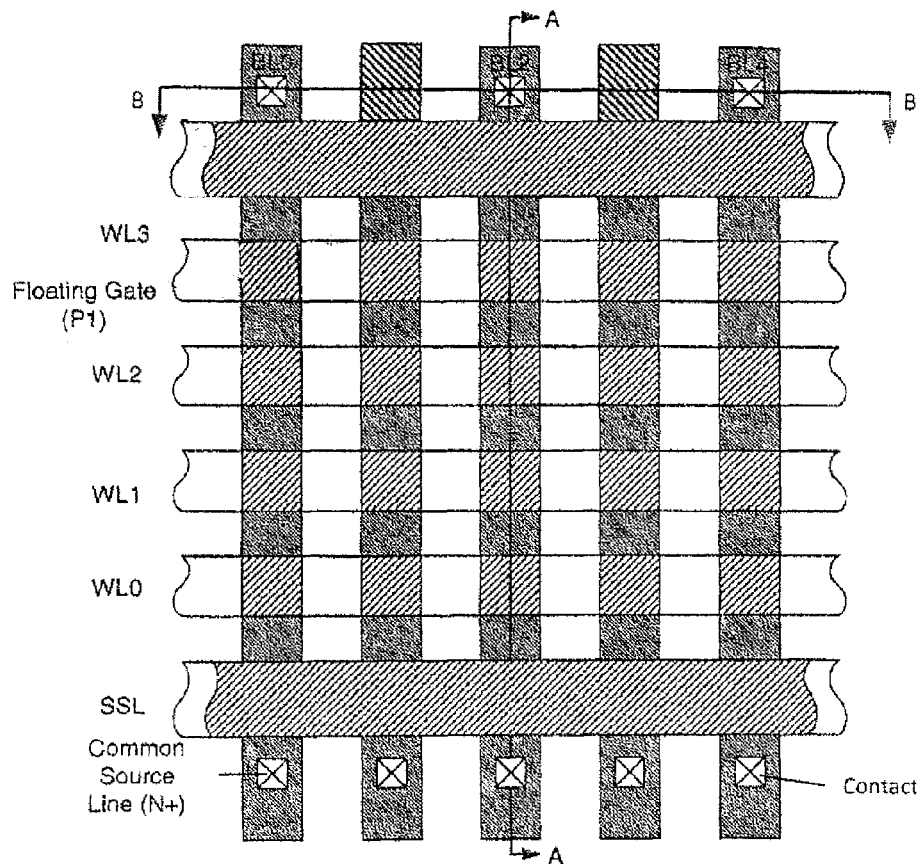
FIG. 2A is a plan view of a prior art NAND array.
Figure 2B:
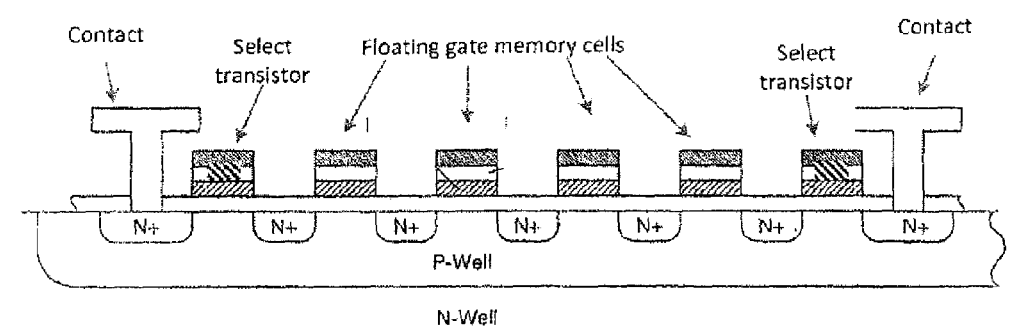
FIG. 2B shows a cross section of the NAND array of FIG. 2A.

FIGS. 2A-2C show different views of a prior art NAND flash memory. In particular, FIG. 2A shows a plan view of a portion of such a memory array including bit lines and word lines (this is a simplified structure with a small number of word lines and bit lines). FIG. 2B shows a cross section along A-A (along a NAND string) showing individual memory cells that are connected in series. Contacts, or vias, are formed at either end to connect the NAND strings in the memory array to conductive lines (e.g. connecting to bit lines at one end and to a common source line at the other end). Such a via may be formed of metal that is deposited into a contact hole that is formed in a dielectric layer. FIG. 2C shows a cross section along B-B of FIG. 2A. This view shows metal vias extending down through contact holes in a dielectric layer to make contact with active areas ("AA") in the substrate (i.e. with N+ areas of FIG. 2B). STI regions are located between active areas of different strings to electrically isolate an individual NAND string from its neighbors. Bit lines extend over the memory array in a direction perpendicular to the cross section shown. Alternating bit lines are connected to vias in the cross section shown. (It will be understood that other vias, that are not visible in the cross section shown, connect the remaining bit lines to other active areas). In this arrangement, locations of vias alternate so that there is more space between vias and thus less risk of contact between vias. Other arrangements are also possible.

As memories become smaller, the spacing between bit lines tends to diminish. Accordingly, capacitive coupling between bit lines tends to increase as technology progresses to ever-smaller dimensions. FIG. 2C shows bit lines formed in a dielectric material. For example, copper bit lines may be formed by a damascene process in which elongated openings, or trenches, are formed in the dielectric layer and then copper is deposited to fill the trenches. When excess copper is removed (e.g. by Chemical Mechanical Polishing, CMP) copper lines remain. A suitable dielectric may be chosen to keep bit line-to-bit line capacitance low.

One way to reduce bit line-to-bit line coupling is to provide an air gap between neighboring bit lines. Thus, rather than maintain dielectric portions between bit lines, the bit lines are formed in a sacrificial layer which is then removed to leave air gaps between bit lines.

Removing sacrificial material between bit lines generally requires some form of etching which may expose bit lines to etch related damage. While a suitable combination of sacrificial material and etch chemistry may be chosen so that sacrificial material is etched at a higher rate than bit line materials, some etching of bit line materials may occur and bit lines may be damaged accordingly. For example, bit line metal and/or barrier layer material may be damaged by etching.

FIG. 3 shows an example of an etch step that removes sacrificial material 301 to form air gaps between bit lines 303a-e. While removing sacrificial material 301 the etch may also remove some bit line metal and/or some barrier layer material and thus damage bit lines. Conductive lines other than bit lines may also be affected. For example, conductive lines in the periphery of a memory array may connect peripheral circuits and may also be affected by etch damage. It is generally desirable to maintain conductive lines, including both metal and barrier layers, intact throughout removal of sacrificial material to form air gaps.

FIGS. 4A and 4B show cross sections of an array area and peripheral area respectively at an intermediate stage of fabrication. These figures illustrate a stage during formation of bit lines and other metal lines using a damascene process. Trenches 411a-411e are formed in sacrificial material layer 413 in the array area where bit lines are to be formed. Similar trenches 411f-g are formed in the peripheral area where conductive lines are to be formed (e.g. connecting peripheral circuits). Underlying dielectric layer 419 and vias 407a-d are shown while the active areas and substrate are omitted for clarity.

FIGS. 5A and 5B show the structures of FIGS. 4A and 4B after deposition of a barrier layer 515. Various materials may be used to form barrier layers depending on the conductive line metal being used (e.g. tungsten, copper, or other metal) and the process requirements. It is common to form a barrier layer as a compound layer made up of individual layers of different materials. An example of such a compound barrier layer is made up of a titanium nitride layer and a titanium layer. Such a barrier layer may be suitable for use with copper as a bit line material in some memory circuits.

FIGS. 6A and 6B show the structure of FIGS. 5A and 5B after deposition of a conductive line metal 619. For example, copper, tungsten, or some other metal may be blanket deposited by Physical Vapor Deposition (PVD), e.g. by sputtering, or by electroplating, Chemical Vapor Deposition, or some other technique.

Excess metal is then removed to leave metal only in trenches thereby forming separate bit lines 619a-e and peripheral lines 619f-g as shown in FIGS. 7A-B. Barrier layer 515 is also divided into separate portions 515a-g in this step, with each barrier layer portion protecting a corresponding conductive metal line. For example Chemical Mechanical Polishing (CMP) may be used to remove metal 619 and to remove barrier layer 515 overlying sacrificial material 413 to expose sacrificial material 413.

FIGS. 7A and 7B show subsequent etching to remove sacrificial material 413. For example, sacrificial material may be silicon oxide (e.g. SiO2) formed using tetraethyl orthosilicate (TEOS) which may be etched using a chlorine (Cl) or fluorine (F) based etch chemistry. It can be seen that while sacrificial material 413 is etched barrier layer material may be exposed to etch conditions. In some cases this may cause damage to barrier layer material.

Figure 8:
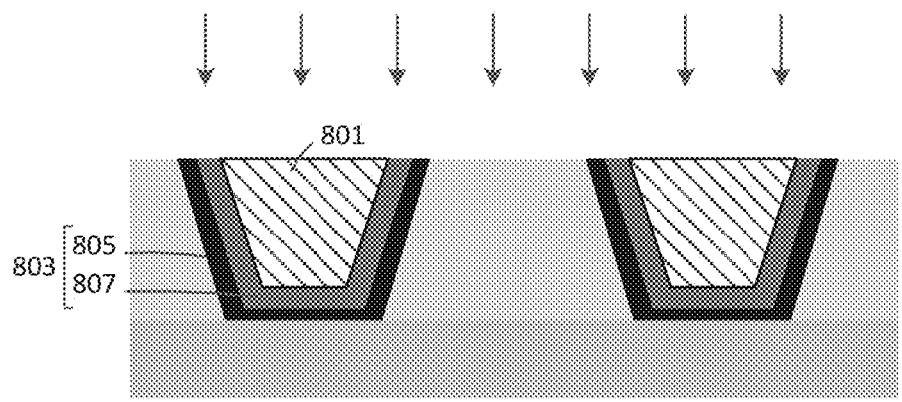
FIG. 8 illustrates bit line structure.

FIG. 8 shows a more detailed view of bit lines that include bit line metal 801 protected by a compound barrier layer 803 formed of an outer barrier layer 805 (e.g. titanium nitride) and an inner barrier layer 807 (e.g. titanium). In general, titanium nitride is more etch resistant than titanium during etching (e.g. wet etching or dry etching). Thus, the titanium nitride layer 805 provides a protective layer around the titanium layer 807 during etching and prevents damage to titanium layer 807. However, some titanium may remain exposed in this structure so that damage may still occur.

Figure 9:
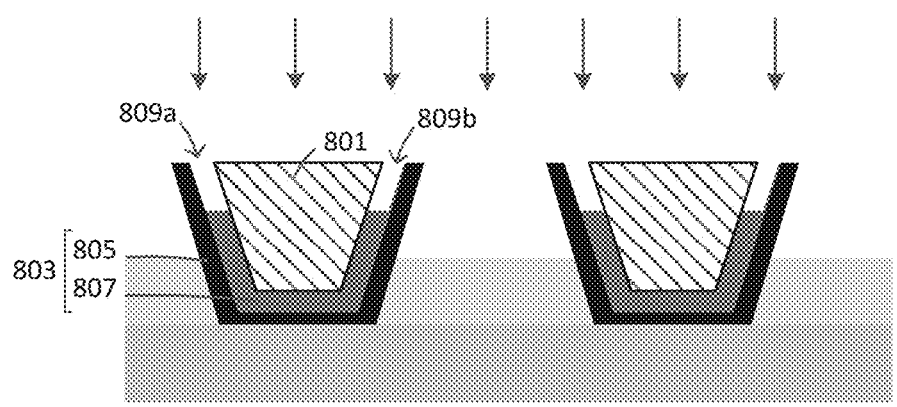
FIG. 9 illustrates etching to form air gaps between bit lines.

FIG. 9 shows how, as etching proceeds, some of inner barrier layer 807 may be etched where it is exposed between the outer barrier layer 805 and conductive metal 801. While the outer barrier layer provides protection from lateral etching, some etching proceeds through the exposed areas of the inner barrier layer 807 at or near the top of the bit line (e.g. areas 809a-b in FIG. 9). This damage to the inner barrier layer 807 may compromise the inner barrier layer. For example, a titanium inner barrier layer may be etched by fluorine or chlorine ions in an etch gas.

An alternative scheme for removing sacrificial material reduces etching of inner barrier layer material that may be exposed between the outer barrier layer and the conductive metal. Using suitable materials and etch chemistry, a suitable etching scheme may produce a byproduct that inhibits further etching. The byproduct may be removed from large exposed areas so that etching on large areas continues while the byproduct remains in small areas (such as the gap between conductive metal and outer barrier layer).

Figure 10:
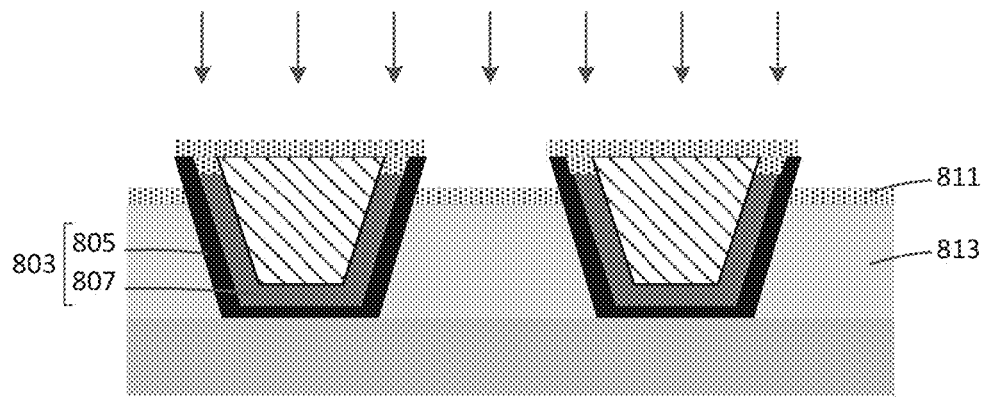
FIG. 10 illustrates an example of an etch step that produces byproduct.

FIG. 10 shows an example of an etching scheme that produces a byproduct 811 that forms a byproduct layer over surfaces as shown. Byproduct 811 generally covers surfaces being etched including surfaces of sacrificial material 813 and inner barrier layer 807. As surfaces being etched become covered with byproduct 811, the etch rate goes down. Such an etch step may be considered self-limiting.

A suitable etch scheme may use Chemical Dry Etching (CDE) with an ammonia (NH3) and hydrofluoric acid (HF) to etch sacrificial material such as silicon oxide thereby producing ammonium fluorosilicate $((NH_4)_2SiF_6)$. Ammonium fluorosilicate may be considered an etch byproduct. Ammonium fluorosilicate may form a layer of byproduct as shown in FIG. 10 which inhibits further etching of sacrificial layer silicon oxide 813 and also inhibits further etching of inner barrier layer 807. An example of etch conditions that may be used in such a CDE step include: temperature=90 degrees Celsius; gas mixture containing NH3 and HF; time=10 seconds; pressure=185.03 Pa.

Figure 11:
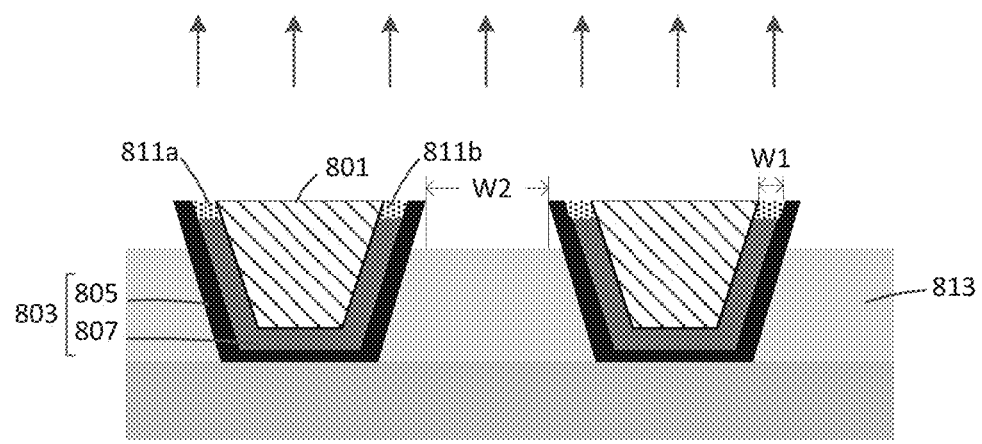
FIG. 11 shows selective removal of byproduct.

When a sufficient depth of byproduct builds up on surfaces being etched, the etch rates drop to very low levels (i.e. there is little or no further etching). A byproduct removal step may remove byproduct so that etching may resume. FIG. 11 shows an example of byproduct removal in which byproduct 811 such as ammonium fluorosilicate is removed. Ammonium fluorosilicate may sublimate under the right conditions so that it is a byproduct that can be removed by applying such conditions (other byproducts may be removed using similar or different conditions). An example of conditions for a removal step include: temperature=90 degrees Celsius; gas mixture without NH3 or HF; time=120 seconds; pressure=185.03 Pa In another example, a removal step may use a higher temperature than the etch step (e.g. 100 degrees Celsius for removal and 90 degrees Celsius for etching). The temperature for an etching step may be below a sublimation temperature for a byproduct while the temperature for a removal step may be above a sublimation temperature for the byproduct. In some cases, removal may be performed at reduced pressure (i.e. under vacuum) and the step may be referred to as a "vacuum" step.

It can be seen in FIG. 11 that substantially all byproduct 811 has been removed from surfaces of sacrificial material 813 between bit lines while some byproduct remains in gaps between outer barrier layer 805 and conductive metal 801 where inner barrier layer 807 has been etched (e.g. byproduct portions 811a-b). The geometry shown favors removal from over sacrificial layer 813 compared with between metal 801 and outer barrier layer 805. In particular, the gap between bit lines has a dimension, W2, which is significantly larger than the dimension of the gap between the outer barrier layer and conductive metal, W1. For example, W1 may be about 1-3 nanometers while W2 may be about 20 nanometers (W2 may be an order of magnitude larger, i.e. W2>10*W1). Because of the different geometries of surfaces of sacrificial material 813 and inner barrier layer 807, byproduct may be removed at very different rates so that the removal process may be considered selective to byproduct overlying the sacrificial material 813. The removal step may stop when all or substantially all byproduct is removed from the sacrificial material 813. A significant amount byproduct may remain on the inner barrier layer 807 at this point so that surfaces of inner barrier layer 807 remains covered.

Figure 12:
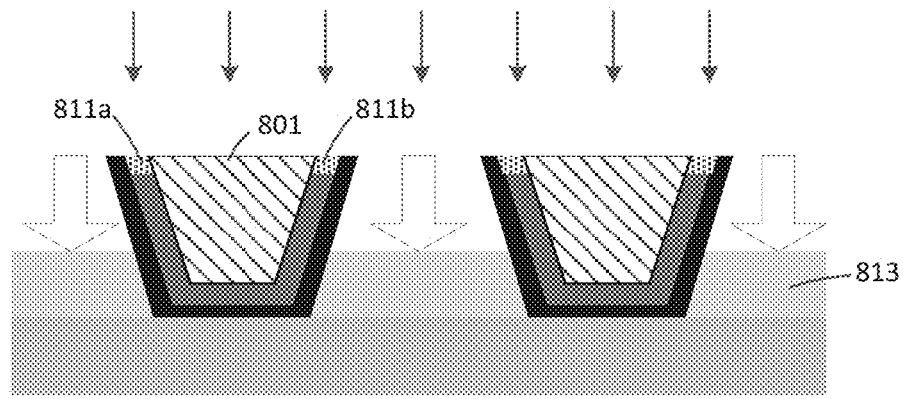
FIG. 12 shows etching while byproduct remains in certain areas.

Subsequent to the removal step of FIG. 11, another etch step may remove additional sacrificial material as shown in FIG. 12. At the start of this step there is little or no byproduct overlying sacrificial material 813 so that the etch rate for the sacrificial material 813 may be relatively high (no inhibiting effect from byproduct). In contrast, byproduct remains overlying the previously exposed area of the inner barrier layer 807 (e.g. portions 811a-b remain). Therefore, etching of the inner barrier layer 807 is inhibited by this byproduct even at the start of the etch step. Little or no etching of inner barrier layer 807 may occur as a result. Thus, as a result of selective removal of byproduct, this etch step may remove sacrificial material without removing significant inner barrier layer material.

Figure 13:
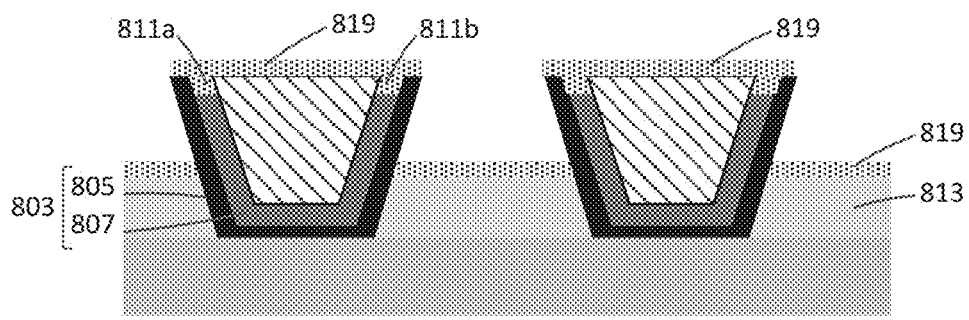
FIG. 13 shows additional byproduct from further etching.

As in the earlier etch step, byproduct is produced which coats surfaces and inhibits further etching as shown by additional byproduct 819 in FIG. 13. This inhibits further etching of sacrificial material 813. Therefore, another removal step may be used to remove additional byproduct 819 from the sacrificial material 813 so that further etching of the sacrificial material 813 can proceed. Portions of byproduct (e.g. portions 188a-b) may remain in place throughout the etch and subsequent removal of additional byproduct 819.

In an example, a series of alternating etch steps and byproduct removal steps are performed until the desired amount of sacrificial material is etched away. Where byproduct removal is selective this cycle of etching and removing produces selective etching of sacrificial material with very little etching of inner barrier layer material. While some etching of barrier layer material may occur (e.g. in first step, or steps) this etching tends to be limited because as the inner barrier material is etched a narrow trench is formed and byproduct tends to remain in such a narrow trench during a subsequent removal step. Thus, significant etching of the inner barrier layer may be confined to one or more early etch steps (and may be confined to a few nanometers in depth) and may not be significant in later steps.

The number of etch-removal steps depends on the amount of sacrificial material to be removed and on the specific process used. In an example, an individual etch step may remove 1-2 nanometers of sacrificial material so that removing 30-40 nanometers of sacrificial material may be achieved with about 30 cycles. In some cases, an etch stop layer may be included in a structure at a level where etching is to cease, i.e. below the sacrificial material. The etch stop layer may have a low etch rate so that when etching reaches the etch stop layer etching becomes very slow.

In general, because the etch steps described above are self-limiting, etching proceeds in a controlled and uniform manner. While some etch processes may be sensitive to temperature variation, variation in electromagnetic field strength, variation in chemical concentration, or other variation in process parameters, a self-limiting etch step such as described above tends to be less sensitive and thus provide good etch uniformity even if some process parameters are not uniform. Etch depth may be controlled by setting the number of cycles. In some cases, a cycle of self-limiting etch and byproduct removal may provide sufficiently uniform etching with enough etch depth control so that an etch stop layer is unnecessary.

After a desired amount of sacrificial material is removed it may be desirable to remove all remaining byproduct including byproduct overlying the inner barrier layer. Thus, after a final etch step, when no further etching is to occur, this byproduct too may be removed. The byproduct removal step used in the cycle described above does not generally remove byproduct at this location at a significant rate. Therefore, an alternative step may be used.

Figure 14:
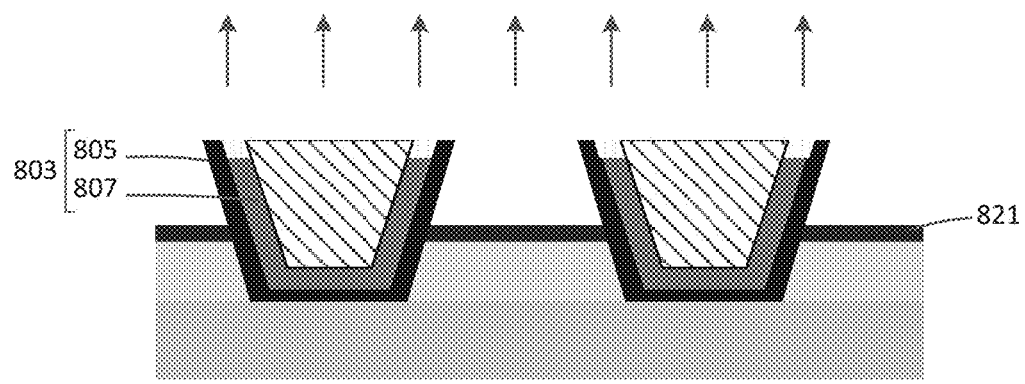
FIG. 14 illustrates a final removal step.

FIG. 14 shows an example of removal of byproduct, including byproduct overlying the inner barrier layer 807, during a final byproduct removal step that is different to earlier byproduct removal steps. For example, this final byproduct removal step may be carried out at an elevated temperature that is significantly higher than the temperature of the earlier byproduct removal steps (e.g. 200 degrees Celsius compared with 90 degrees Celsius). Such a step may be referred to as an "anneal" step or Post Heat Treatment (PHT) step and may be carried out at an elevated temperature that is higher than a sublimation temperature of a component of the byproduct that is to be removed.

FIG. 14 shows an etch stop layer 821. A suitable material for an etch stop layer may be silicon nitride (SiN). In some cases sufficient control of etch depth is achieved using alternating etch and removal steps so that no etch stop layer may be used while in other cases an etch stop layer may be used with alternating etch and removal steps to provide additional control of etch depth.

Equilibrium

Figure 15:
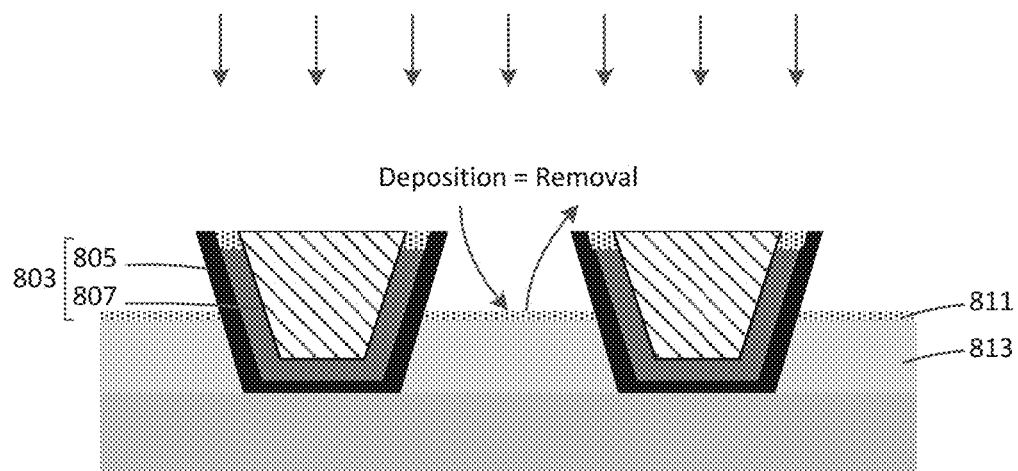
FIG. 15 shows an example of a process in equilibrium.

An alternative to the cycled process described above is illustrated in FIG. 15. In some cases, a self-limiting etch step may be controlled so that it is in equilibrium with the rate of byproduct removal being equal to the rate of generation of byproduct (at least in a particular area such as over sacrificial layer 813). In the example shown, the rate of byproduct generation by etching sacrificial material 813 is equal to the rate of byproduct removal over sacrificial layer 813 with little or no byproduct remaining on surfaces of sacrificial layer 813. On the other hand, the rate of byproduct removal over inner barrier layer 807 may initially be lower than the rate of generation at this location so that some buildup of byproduct occurs in these locations. Subsequently, equilibrium may occur at these locations. However, equilibrium may occur with a very low etch rate and low removal rate so that little or no etching of inner barrier layer 807 occurs. An example of conditions that may be used to maintain equilibrium are 100 degrees Celsius; gas mixture containing NH3 and HF; time=200-300 seconds (this depends on etching amount; in this case, It is expected to be etched by ca. 20-30 nm); pressure=185.03 Pa.

When a process is maintained in equilibrium a single etch step may continue until the desired amount of sacrificial material is removed. Then, a single final removal step may be performed to remove all byproduct. This may be similar to the final byproduct removal step described above. Thus, rather than performing multiple cycles of etching and removing byproduct, a single etch step may be performed followed by a single byproduct removal step. The etch depth may be controlled by time rather than by the number of cycles. Alternatively, multiple steps may be performed under equilibrium conditions.

Figure 16:
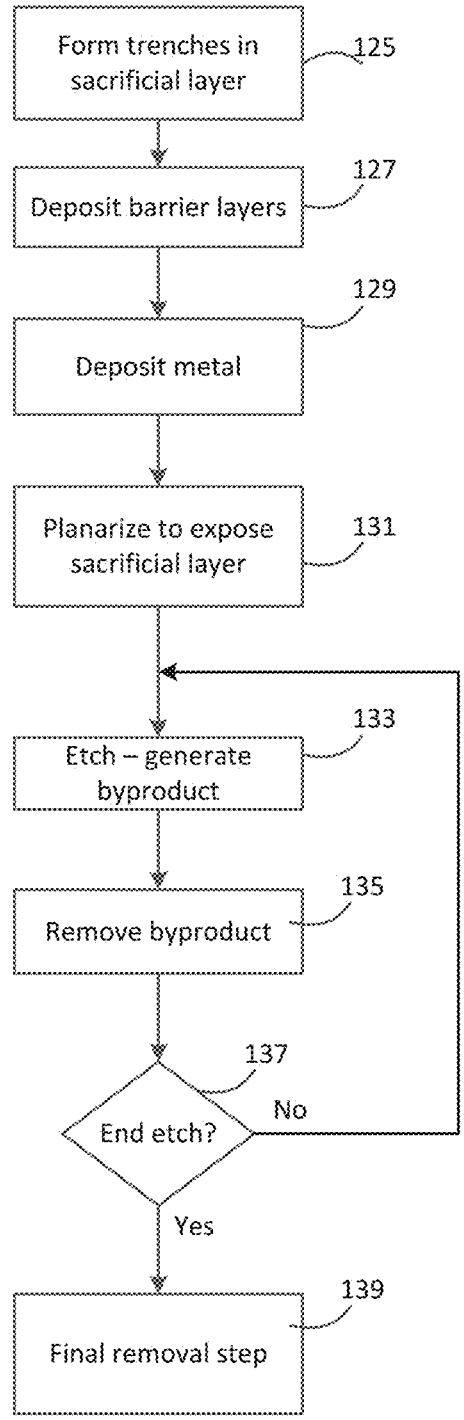
FIG. 16 shows an example of process steps to form air gaps between bit lines.

FIG. 16 illustrates an example of steps used to form bit lines with air gaps. Trenches are formed in a sacrificial layer 125 (e.g. in a silicon oxide layer such as SiO2). Subsequently, a barrier layer is formed of multiple individual layers (e.g. at least two layers, an inner barrier layer such as titanium and an outer barrier layer such as titanium nitride). Subsequently a conductive metal such as copper, tungsten, or other metal, is deposited over the barrier layers 129. A planarization step is performed 131 to remove excess metal and to expose the sacrificial layer between bit lines so that it may be removed. An etch step (e.g. CDE using ammonia and HF) is performed 133 and generates a byproduct (e.g. containing ammonium fluorosilicate) that inhibits further etching as the etch step continues. A removal step is performed 135 to remove the byproduct from over the sacrificial layer (thereby exposing the sacrificial layer) while maintaining the byproduct in other locations such as over the inner barrier layer (thereby leaving the inner barrier layer unexposed). Subsequently, if the etch is not finished 137 (i.e. if the desired etch depth has not been achieved) then the process continues to perform another etch step 133 and another removal step 135. A number of such cycles may be performed in order to remove a desired amount of sacrificial material. When the desired amount of sacrificial material is removed then the etch ends 137 and a final removal step is performed 139 to remove remaining byproduct (e.g. to remove byproduct from all locations including over the inner barrier layer).

CONCLUSION

Although the various non-limiting examples have been described with respect to the present drawings, it will be understood that protection within the full scope of the appended claims is appropriate. Furthermore, although methods for implementation are discussed with respect to particular prior art structures, it will be understood that examples may be implemented in memory arrays with architectures other than those described.

It is claimed:

1. A method of forming an air gap between adjacent conductive lines comprising:
   forming a plurality of trenches in a dielectric layer that is formed of a dielectric material;
   subsequently forming a first barrier layer in the plurality of trenches;
   subsequently forming a second barrier layer over the first barrier layer; and
   subsequently filling the plurality of trenches with a conductive metal to form bit lines;
   subsequently removing dielectric material between bit lines by:

(a) performing a Chemical Dry Etching (CDE) step
under a first set of process conditions
thereby substantially etching the dielectric material and the second barrier layer simultaneously
without substantially etching the first barrier layer such that the first barrier layer extends above the dielectric material and second barrier layer,
the etching of the dielectric material under the first set of process conditions
producing a byproduct that suppresses the etching of the dielectric material; and
(b) subsequently performing a removal step
to remove the byproduct of the etching of the dielectric material in the CDE step
under a second set of process conditions.

2. The method of claim 1 wherein the second barrier layer is formed of a barrier metal; and
the first barrier layer is a nitride or an oxide of the barrier metal.

3. The method of claim 1 wherein under the first set of process conditions an etchant is supplied; and
under the second set of process conditions no etchant is supplied.

4. The method of claim 1 wherein the first set of process conditions includes a first temperature that is lower than a sublimation temperature of the byproduct, and
the second set of process conditions includes a second temperature that is higher than the sublimation temperature of the byproduct.

5. The method of claim 1 further comprising repeating steps (a) and (b) two or more times until a predetermined amount of the dielectric material is removed.

6. The method of claim 3 wherein the etchant is a gas containing fluorine (F) and hydrogen (H); and
the byproduct contains ammonium fluorosilicate $((NH_4)_2SiF_6)$.

7. The method of claim 1 further comprising:
(c) subsequently, after a predetermined amount of the dielectric material is removed, performing an anneal step at a temperature that his higher than any of: a sublimation temperature of the byproduct and any temperature of the first or second sets of process conditions.

8. The method of claim 1 wherein the second barrier layer is exposed to the CDE step in an opening between the first barrier layer and the conductive metal, the opening having a width that is equal to or smaller than 1/10 of a width of exposed dielectric portions between the bit lines.

9. The method of claim 1 wherein the first barrier layer is titanium nitride (TiN), the second barrier layer is titanium (Ti), and the conductive metal is copper (Cu).

10. The method of claim 1 wherein the first set of process conditions provide equilibrium between producing the byproduct and removing the byproduct from areas between the bit lines while generating some buildup of the byproduct over exposed areas of the second barrier layer to provide suppressed etching of the second barrier layer, and wherein the second set of process conditions is sufficient to remove the byproduct only from the areas between the bit lines.

11. The method of claim 1
wherein an area of the second barrier layer is exposed to the CDE step and the area has a width along a direction perpendicular to the bit lines that is smaller than a distance between neighboring bit lines.

12. A method of forming air gaps between bit lines comprising:
(a) forming a plurality of bit lines
in a dielectric material,
an individual bit line having
an inner barrier layer and
an outer barrier layer;
(b) subsequently etching the dielectric material using an etch step
that etches the inner barrier layer,
does not significantly etch the outer barrier layer, and
etches the dielectric material
to produce a byproduct that suppresses further etching,
wherein the inner barrier layer and dielectric material are etched simultaneously such that the outer barrier layer extends above the inner barrier layer and the dielectric material;
(c) subsequently removing the byproduct using a removal step
that removes substantially all of the byproduct from over the dielectric material between bit lines and
leaves at least some of the byproduct on surfaces of the inner barrier layer; and
(d) repeating steps (b) and (c) until a predetermined amount of the dielectric material is removed.

13. The method of claim 12 wherein the inner barrier layer is formed of titanium, the outer barrier layer is formed of titanium nitride, and the byproduct is ammonium fluorosilicate $((NH_4)_2SiF_6)$.

14. The method of claim 13 wherein the etch step is performed using a gas mixture that contains fluorine (F) and hydrogen (H).

15. The method of claim 14 wherein the etch step is performed at a temperature below the sublimation temperature of ammonium fluorosilicate and the removal step is performed at a temperature above the sublimation temperature of ammonium fluorosilicate.

16. The method of claim 15 further comprising, subsequent to (d), performing an anneal step to remove any remaining byproduct from over the dielectric material between bit lines and from surfaces of the inner barrier layer.

17. A method of forming air gaps between bit lines comprising:
(a) forming a plurality of bit lines
in a sacrificial layer of silicon oxide,
an individual bit line having
an inner barrier layer of titanium and
an outer barrier layer of titanium nitride;
(b) subsequently etching the silicon oxide using an etch step
that etches the titanium of the inner barrier layer,
does not significantly etch the titanium nitride of the outer barrier layer, and
etches the silicon oxide
to produce a byproduct containing ammonium fluorosilicate $((NH_4SiF_6)$ that suppresses further etching,
wherein the titanium and silicon oxide are etched simultaneously such that the outer barrier layer extends above the inner barrier layer and the sacrificial layer;
(c) subsequently removing the byproduct using a removal step
that removes substantially all of the byproduct from over the silicon oxide between bit lines and
leaves at least some of the byproduct on surfaces of the inner barrier layer; and
(d) repeating steps (b) and (c) until a predetermined amount of the silicon oxide is removed.

18. The method of claim 17 wherein subsequent to removing the predetermined amount of silicon oxide a final removal step removes substantially all of the byproduct on surfaces of the inner barrier layer.

19. The method of claim 18 wherein the removal step applies a temperature below 150 degrees centigrade and the final removal step applies a temperature above 150 degrees centigrade.

20. The method of claim 17 wherein step (b) etches approximately 1-2 nanometers of silicon oxide and is repeated at least 10 times.

* * * * *